(12) United States Patent
Takahashi et al.

(10) Patent No.: US 6,513,644 B1
(45) Date of Patent: Feb. 4, 2003

(54) APPARATUS AND METHOD FOR ALIGNING PARTS

(75) Inventors: Shigeki Takahashi, Omihachiman (JP); Nihei Kaishita, Omihachiman (JP)

(73) Assignee: Murata Manufacturing Co., Ltd., Nagaokakyo (JP)

(*) Notice: Subject to any disclaimer, the term of this patent is extended or adjusted under 35 U.S.C. 154(b) by 423 days.

(21) Appl. No.: 09/109,407

(22) Filed: Jul. 2, 1998

(30) Foreign Application Priority Data

Jul. 3, 1997 (JP) .............................................. 9-194872
Jun. 22, 1998 (JP) ........................................... 10-174182

(51) Int. Cl.[7] .............................................. B65G 47/14
(52) U.S. Cl. ....................................... 198/396; 198/455
(58) Field of Search ................................. 198/396, 455; 221/163, 168

(56) References Cited

U.S. PATENT DOCUMENTS

| | | | | |
|---|---|---|---|---|
| 1,600,715 A | * | 9/1926 | Cameron | 198/396 |
| 1,807,673 A | * | 6/1931 | Risser | 198/396 |
| 4,014,460 A | * | 3/1977 | Bryan | 198/396 |
| 4,270,670 A | | 6/1981 | Cristiani et al. | |
| 5,649,356 A | | 7/1997 | Gieskes | |
| 6,019,212 A | * | 2/2000 | Takahashi et al. | 198/396 |

FOREIGN PATENT DOCUMENTS

| | | |
|---|---|---|
| GB | 2013637 | 8/1979 |
| JP | 44-7997 | 4/1969 |
| JP | 60-81925 | 6/1985 |
| JP | 8-143164 | 6/1996 |
| JP | 9-142651 | 3/1997 |
| JP | 9-143164 | 7/1997 |

* cited by examiner

Primary Examiner—Joseph E. Valenza
(74) Attorney, Agent, or Firm—Burns, Doane, Swecker & Mathis, LLP

(57) ABSTRACT

A subject part-aligning apparatus has a simple structure and causes less damage to chip parts, and operates well even if a chip discharge passage thereof is clogged or overflows with the chip parts. The apparatus has a part-holding chamber for accommodating a number of chip parts. An arc-shaped chute groove is formed in the inner surface of the bottom of the part-holding chamber to orient the chip parts in a given direction and to slidably guide the chips. A gate port is formed at the lower end of the chute groove to permit the chip parts sliding downward in a given orientation along the chute groove to pass in series (e.g., one by one). The discharge passage is formed to be tangential to the chute groove to align the passed chip parts in a line and to discharge the chip parts. A rotary impeller having blades is mounted in the part-holding chamber. The blades urge any chip part halted in an abnormal orientation in the gate port toward a direction opposite to the direction in which the chips are discharged.

25 Claims, 8 Drawing Sheets

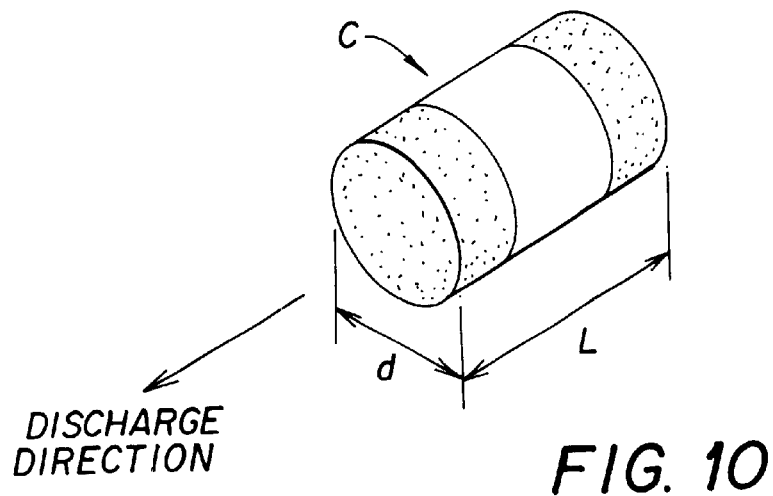
FIG. 10
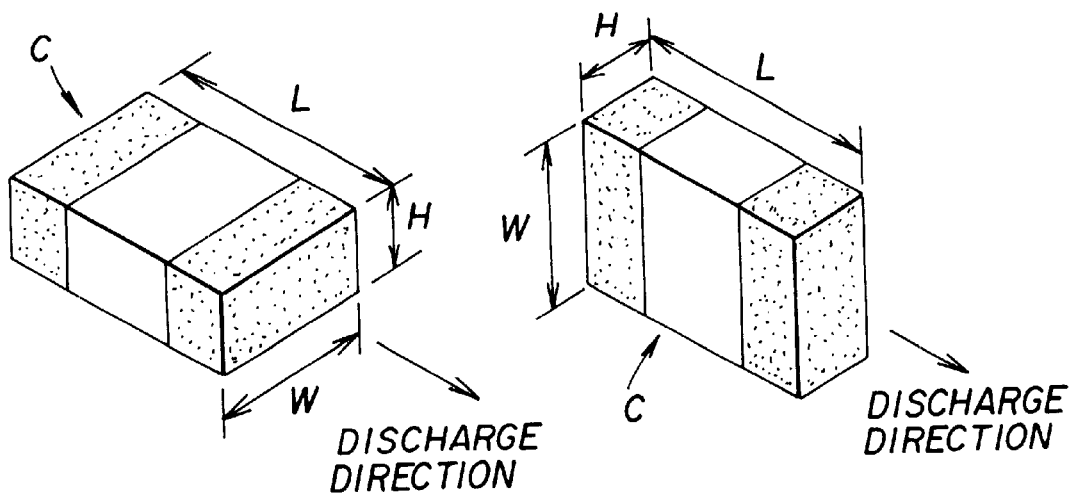
FIG. 10A
FIG. 10B

APPARATUS AND METHOD FOR ALIGNING PARTS

This application corresponds to Japanese Patent Application No. 9-194872, filed on Jul. 3, 1997, which is hereby incorporated by reference in its entirety.

BACKGROUND OF THE INVENTION

The present invention relates to an apparatus and method for aligning a multiplicity of chip parts in a row and delivering the chip parts in sequence.

Known part-aligning apparatus of the above-mentioned kind include bulk feeders and vibrating ball feeders. Bulk feeders are roughly classified into pneumatically driven bridge-breaking type feeders and bridge-breaking type feeders which use an upward-thrusting pin in operation. In the case of the pneumatically driven type of feeder, it is difficult to adjust the amount and direction of airflow. In the case of the upward-thrusting pin type of feeder, whenever an operation is performed, the pin impacts the parts and so the parts tend to be easily scratched or damaged. In both types, every chip part is forced toward a funnel-like exit. Therefore, if a bridge-breaking operation is performed once, the bridge may be immediately restored. As a consequence, the efficiency at which parts are aligned is low. In the case of the vibrating ball type of feeder, bridges are not readily formed. However, this equipment is expensive. Also, unwanted vibration is easily transmitted to other apparatus. Furthermore, a large space is required for this type of equipment.

A part-aligning apparatus free of these problems is proposed in Japanese Unexamined Patent Publication No. 143164/1996. This apparatus comprises a cylindrical stocker for holding chip parts, an annular body disposed on the outer surface of the outer curved wall of the stocker, and a rotary disk having an annular indexing portion. This indexing portion is rotatably disposed in the gap between the outer curved wall of the stocker and the inner surface of the annular body. The indexing portion has a plurality of chip-holding recesses for individually seizing the chip parts. A chip discharge hole in communication with a chip storage portion is formed near the bottom of the outer wall of the stocker and in the path over which the chip-holding recesses are moved. In this case, movement is provided only by rotary motion, and accordingly, it is easier to make an adjustment. The chip parts are damaged less. In addition, the apparatus can be easily built to have a smaller size.

However, the above-described part-aligning apparatus requires at least the stocker, the annular body, and the rotary disk. Therefore, this apparatus is complex in structure and often breaks down. It is necessary that the rotary disk has chip-holding recesses arranged circumferentially, the recesses conforming to the shapes of the individual chip parts. In order to align minature chip parts having a length of about 1 mm long, the chip-holding recesses must be processed in correspondingly small size. Hence, the apparatus is very complex in structure and laborious to machine, thus increasing the cost.

The chip parts are held in series (e.g., the chips are held adjacent to each other in a line) by the chip-holding recesses in the indexing portion of the rotary disk. As the disk turns, the chip parts are forced toward a chute. Therefore, if the chute becomes clogged or overflows with chip parts for some reason, a chip part subsequently fed in will be caught in the chute. As a result, the chip part may be damaged or the apparatus itself may break down. At this time, therefore, it is necessary to quickly stop the rotary disk using a "full occupation" sensor.

SUMMARY OF THE INVENTION

It is an object of the present invention to provide a part-aligning apparatus that is simple in structure, less damaging to chip parts to be aligned, and functions well even if the chip discharge passage becomes clogged or overflows.

It is another object of the invention to provide a method of aligning chip parts without being affected by clogging of the chip discharge passage or by overflow of the chute such that the chip parts are less damaged than heretofore.

The above objects are achieved in accordance with the teachings of the invention by an apparatus comprising: a part-holding chamber for accommodating a multiplicity of chip parts; a chute groove formed at least in the inner surface of the bottom of the part-holding chamber and acting to orient the chip parts in a given direction and to cause the chip parts to slide downward; a gate port formed at the lower end of the chute groove for passing the chip parts in series (e.g., one by one), wherein the chip parts slide downward in a given orientation along the chute groove; a discharge passage for aligning the chip parts which have passed through the gate port in a line for discharging; and a rotary impeller having blades rotatably held in the part-holding chamber. The blades have front end portions passing over the gate port. The blades of the impeller are rotated to displace any chip part halted in an abnormal orientation in the gate port toward a direction different from a direction in which the chip parts are discharged, thus preventing the gate port from clogging.

The chip parts introduced into the part-holding chamber are collected on the inner surface of the bottom of the part-holding chamber by the force of gravity, which causes the chips parts to fall into the chute groove. The chute groove has a width which allows the chip parts to fall into the chute groove in a given orientation. For example, where a chip part has a rectangular prism shape, e.g., the length is greater than the width and the height, if the width of the chute groove is set slightly larger than the width and the height of the chip parts, the chute groove can align the chip part in the longitudinal direction of the chip part. Each chip part falling into the chute groove is slid downward by gravity and brought to the gate port. If the chip part is in a correct orientation (e.g., a laid-down orientation), the chip part passes through the gate port without difficulty. This chip part is then discharged into a discharge passage. However, if a chip part in an abnormal orientation (e.g., an elevated or upright orientation) reaches the gate port, the part clogs the port because it can not pass through the port in this orientation. Since the blades of the rotary impeller regularly pass over the gate port, the chip part stopped at the gate port is displaced in a direction different from the direction in which chip parts are discharged. The result is that the clogging chip part is removed from the gate port or at least knocked over to assume its normal orientation. This prevents the clogging. Hence, the chip parts arranged in back of the once-clogging chip part can be discharged through the gate port.

The chip part stopped at the gate port may be displaced in a direction that is opposite, or at an angle, to the discharge direction. Any direction may be adequate as long as the clogging can be prevented.

When a rotary impeller is rotated intermittently, the chip part stopped at the gate port can be laid down easily, thereby improving the clogging preventing effect.

When a guide surface for sliding the chip parts into the chute groove is formed on an inner surface of the part-holding chamber, the chip part slides smoothly into the chute groove, thus improving the efficiency of alignment. This guide surface may be an inclined surface, or a curved surface, as long as the chip part can be slided down to the chute groove smoothly by the guide surface.

When a part-holding chamber may be cylindrical space whose central axis is a horizontal axis, a chute groove is an arc-shaped groove formed on an inner surface of the cylindrical space, the discharge passage is formed substantially tangential to the arc-shaped chute groove, and the gate port is formed at the junction of the chute groove and the discharge passage, then the chip part moves smoothly from the chute groove into the discharge passage through the gate port. It is not limited to that the discharge passage is formed precisely tangential to the chute groove. The discharge passage may be inclined thereto.

In another exemplary embodiment of the invention, a plurality of chute grooves are formed in parallel in the inner surface of the part-holding chamber, and a gate port and discharge passage are formed at the lower end of each chute groove. In this case, chip parts are aligned with improved efficiency.

The present invention is suited for alignment of chip parts formed in a rectangular prism shape, e.g., where the length is greater than the vertical and lateral dimensions of the chip part. However, in addition to rectangular chip parts, the invention can be applied to align and deliver cubic chip parts and cylindrical chip parts.

BRIEF DESCRIPTION OF THE DRAWINGS

The foregoing and other objects, features and advantages of the present invention will be more readily understood upon reading the following detailed description in conjunction with the drawings in which:

FIG. 10 is a perspective view of another example of a chip part; and

FIGS. 11A and 11B are perspective views of further examples of chip parts.

DESCRIPTION OF THE PREFERRED EMBODIMENTS

Figure 5:
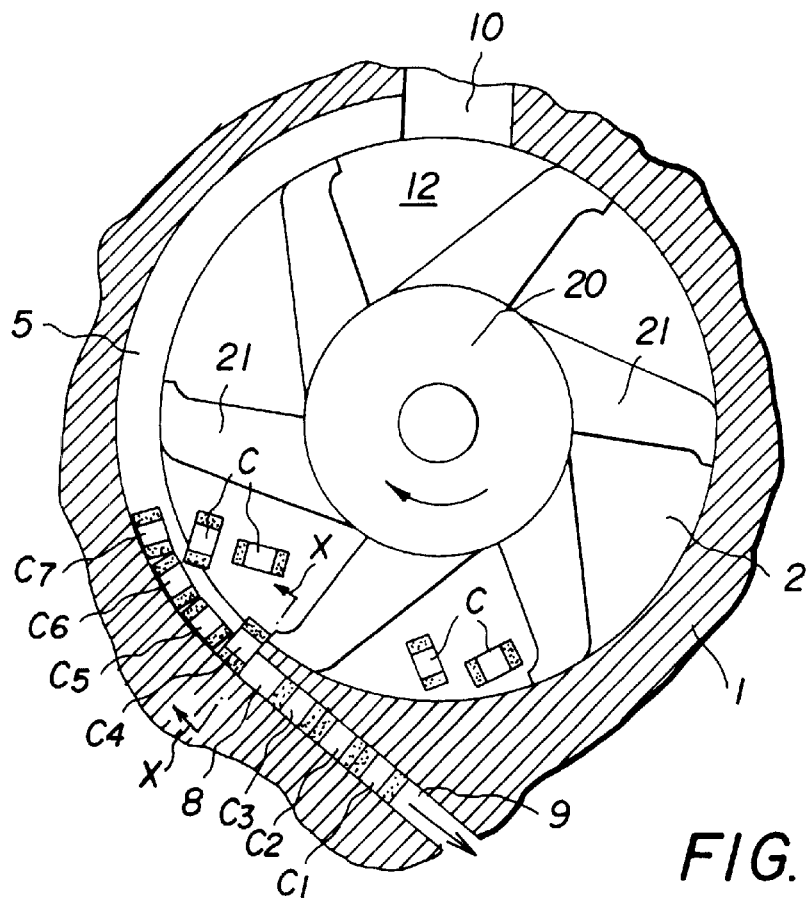
FIG. 5 is a diagram illustrating an operation for preventing clogging in a part-aligning apparatus in accordance with the present invention.
Figure 6:
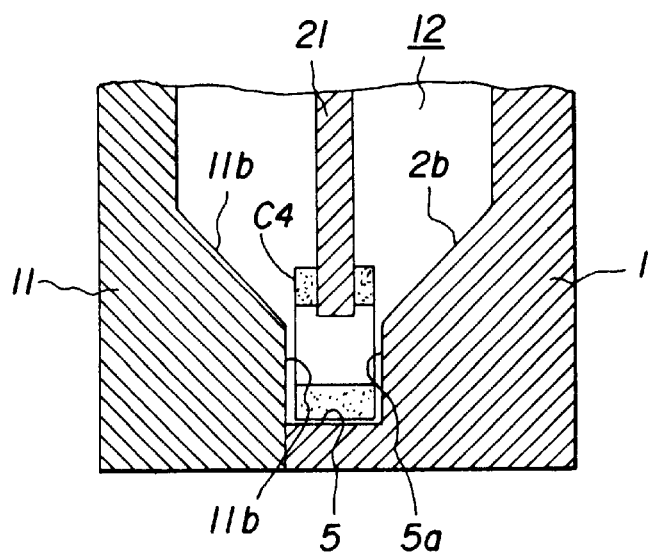
FIG. 6 is a cross-sectional view taken on line X—X of FIG. 5.
Figure 7:
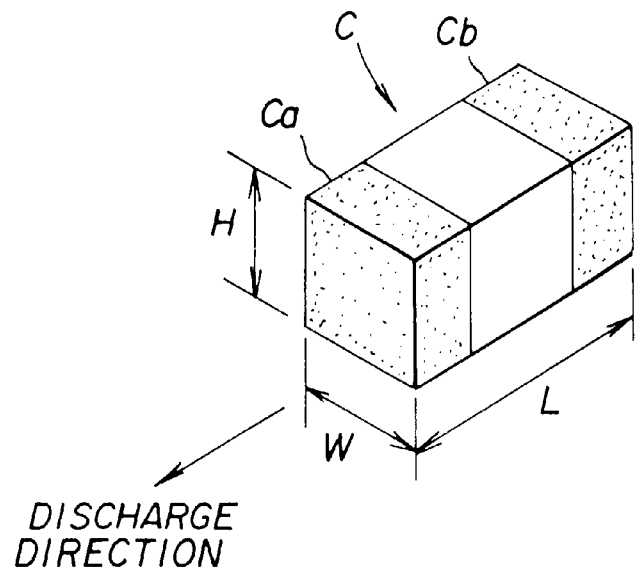
FIG. 7 is a perspective view of one example of a chip part.

An exemplary part-aligning apparatus in accordance with the present invention is shown in FIGS. 1–6. This apparatus aligns chip parts, one example of which is shown in FIG. 7, where a chip part C has a rectangular prism form with a height of H, a width of W, and a length of L (where H≈W, L>H, and L>W). Electrodes Ca and Cb are formed at the longitudinal ends of the chip part C, respectively.

A drum body 1 is made of a hard plate and provided with a substantially circular recess 2 in its surface. A bearing 4 is mounted in the center of the recess. An arc-shaped step surface 5a is formed on the inner surface of the recess 2 such that the step surface 5a has a width equal to the sum of the width W of the chip part C and a given clearance and a depth equal to a sum of the height H of the chip part C and a given clearance. This step surface 5a forms a chute groove 5 together with the inner side surface 11a of a cover 11 (described later).

An angle $\theta_1$ extends from one edge of the circular recess 2 to a plumbline extended from the center of the recess 2. An angle $\theta_2$ extends from another edge of the circular recess 2 to the same plumbline. The angles $\theta_1$ and $\theta_2$ together demarcate a cutout 2a. A first block 6 is screwed or otherwise fixed to this cutout 2a. A continuous arc-shaped surface is formed across both recess 2 and block 6. Continuous tapered guide surfaces 2b and 6a are formed in the inner surface of the recess 2 and in the inner surface of the block 6, respectively. More specifically, the tapered guide surface 2b formed in the inner surface of the recess 2 is tilted toward the chute groove 5 and functions to guide the chip part C toward the chute groove 5.

Figure 1:
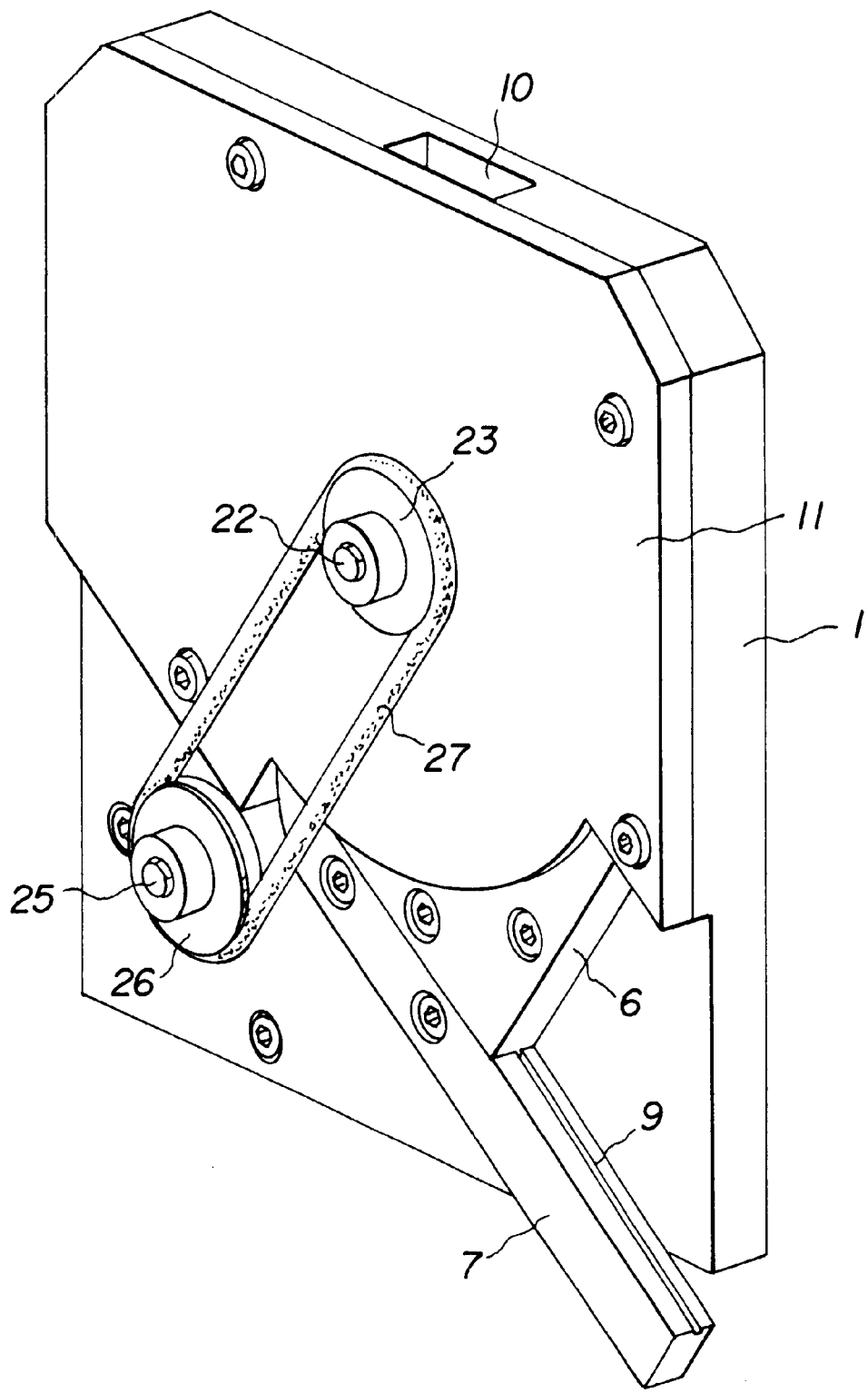
FIG. 1 is a perspective view of an exemplary embodiment of the part-aligning apparatus in accordance with the present invention.
Figure 2:
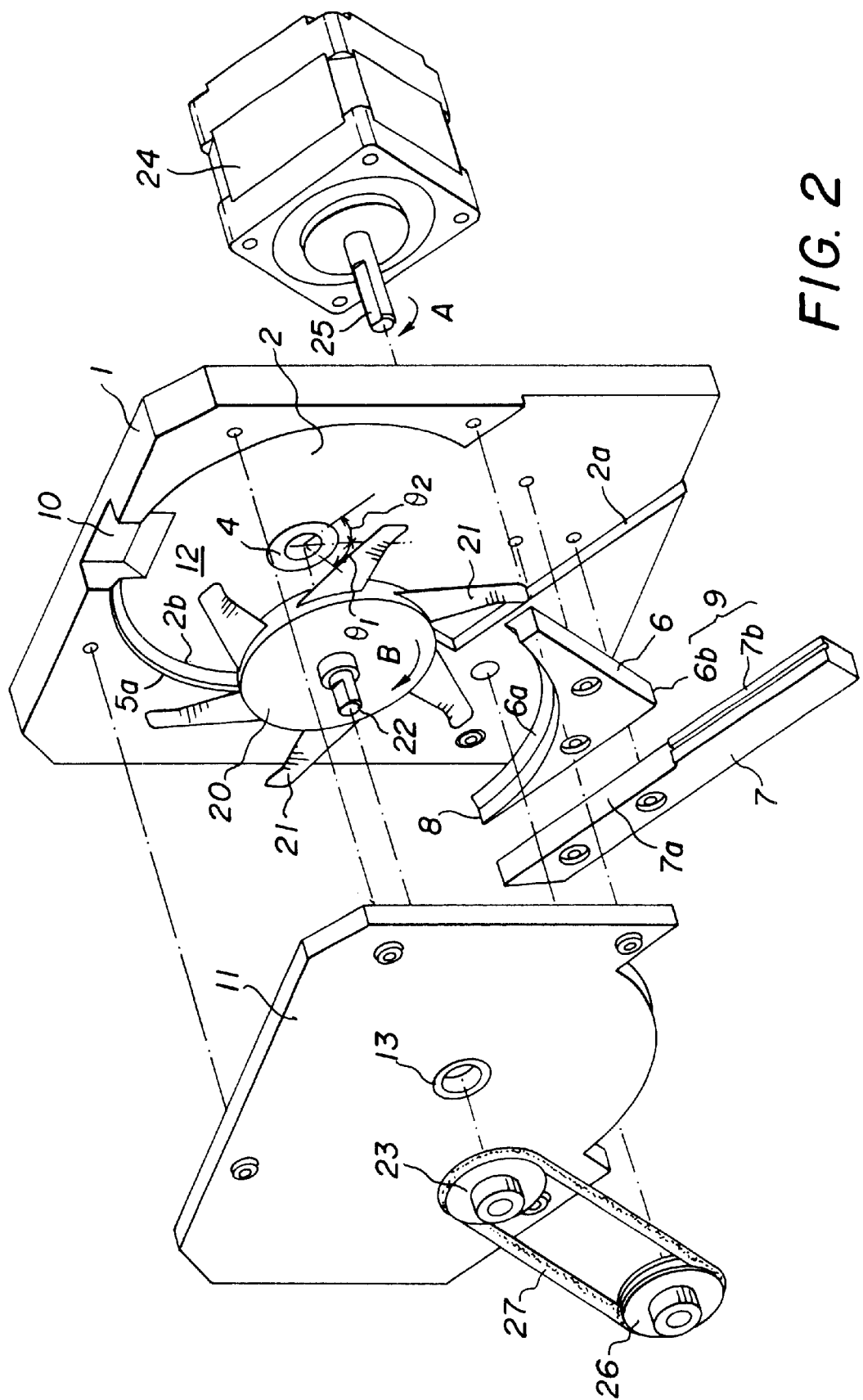
FIG. 2 is an exploded perspective view of the part-aligning apparatus shown in FIG. 1.
Figure 3:
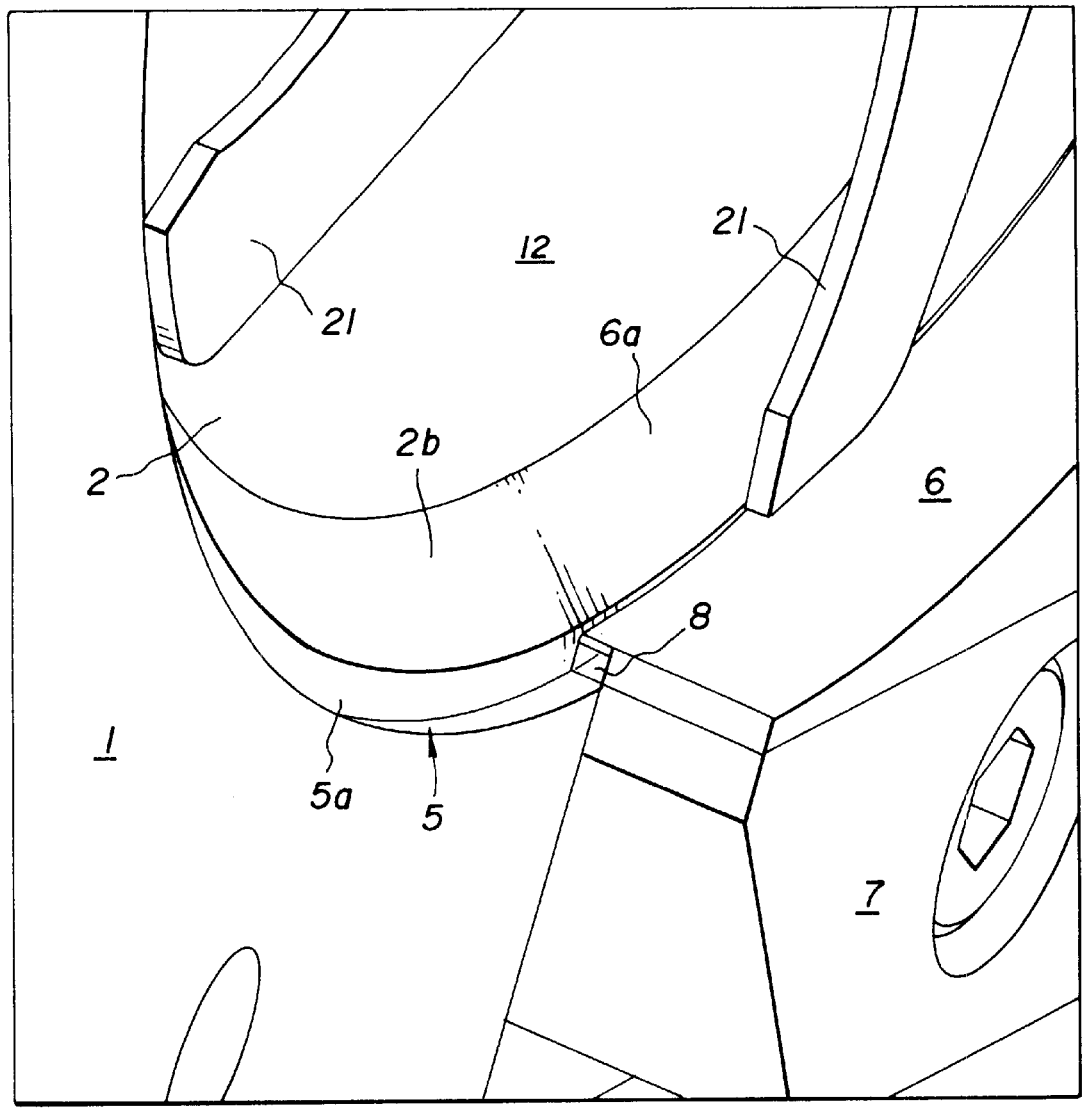
FIG. 3 is an enlarged perspective view of the gate port of the part-aligning apparatus shown in FIG. 1.
Figure 4:
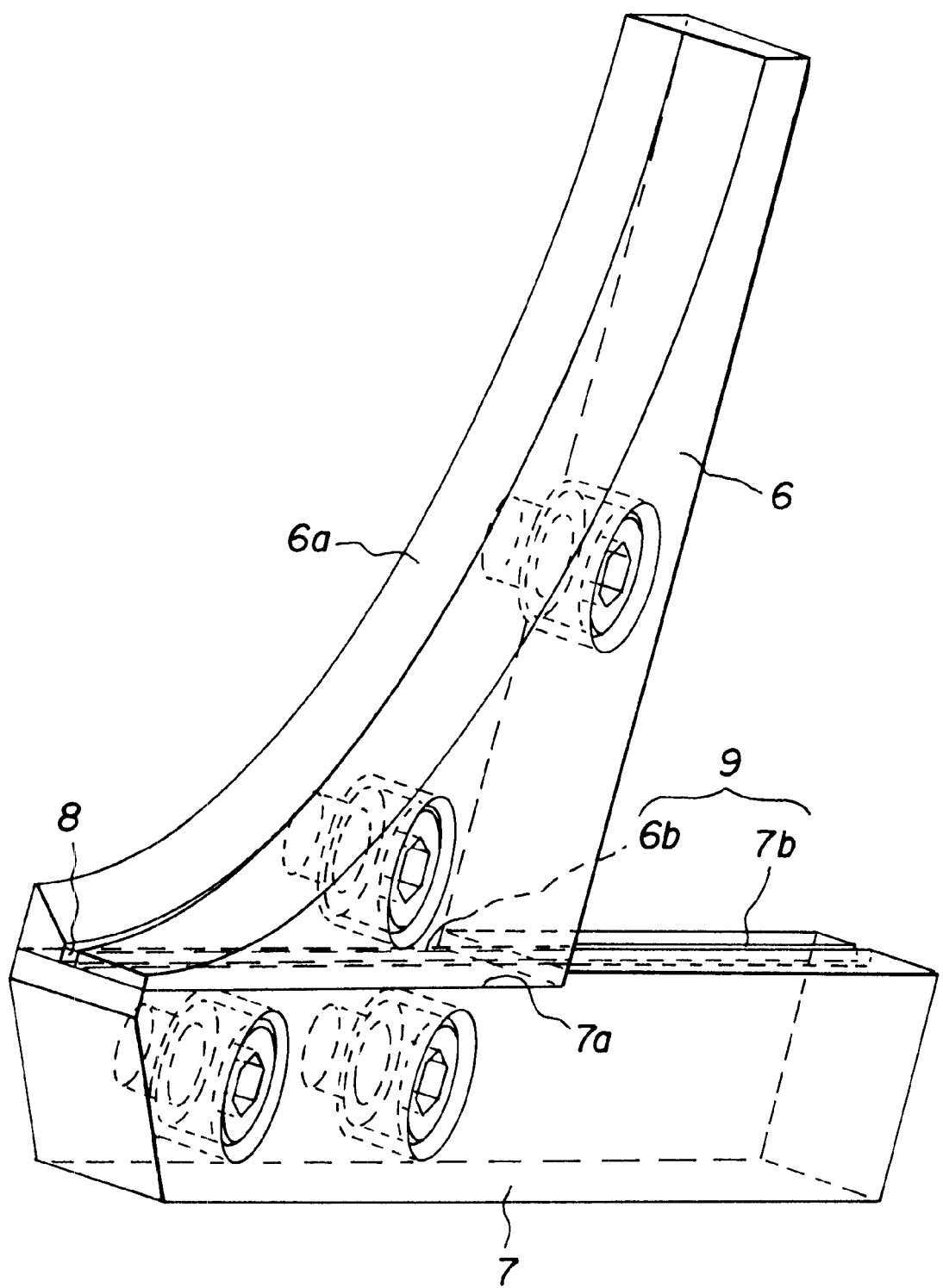
FIG. 4 is an enlarged perspective view of the first and second blocks of the apparatus shown in FIGS. 1–3.

A second block 7 is fixed in the cutout 2a of the recess adjacent to the bottom surface of the first block 6. As shown in FIG. 4, a first groove 6b is formed in the bottom surface of the first block 6. A flat surface 7a closing off the bottom surface of the first block 6 and a second groove 7b continuous with the first groove 6b are formed in the top surface of the second block 7. The first block 6 and the second block 7 are fixed to the drum body 1, forming a gate port 8 and a discharge passage 9 that are placed in communication with the chute groove 5 through two grooves 6b and 7b, respectively. The discharge passage 9 is formed to be tangential to the arc-shaped chute groove 5 and is tilted downward to define a slide angle of the chip part. The gate port 8 is formed at the junction of the arc-shaped chute groove 5 and the tangential discharge passage 9. The gate port 8 is large enough so that the chip parts C supplied in the longitudinal direction can pass in series (e.g., one by one). That is, the height and the width of the gate port are formed slightly larger than H and W, respectively, and less than L of the chip part C. According to one exemplary embodiment, the gate port 8 is identical in width to the chute groove 5. A part introduction port 10 in communication with the recess 2 is formed in the top surface of the drum body 1.

A cover 11 for closing the recess 2 is mounted to the surface of the drum body 1. A part-holding chamber 12 for accommodating a number of chip parts C is formed between the cover 11 and the recess 2. Preferably, the cover 11 is made of a transparent material such as a resin to permit visual verification of the quantity of the chip parts C in the part-holding chamber 12. The inner surface 11a of the cover 11 is opposite to the step surface 5a of the drum body 1. The chute groove 5 is formed between these components. A bearing 13 is mounted to the center of the cover 11 in an opposite relation to the bearing 4 of the drum body 1. A tapered guide surface 11b opposite to the tapered guide surfaces 2b and 6a is formed in the inner surface of the cover 11, as shown in FIG. 6.

A rotary impeller 20 is rotatably held inside the part-holding chamber 12, and is equipped with plural blades 21

(6 blades in the illustrated example) protruding outward from a base portion of the rotary impeller 20. The blades 21 can extend in a radial direction of the rotary impeller 20, or in a direction that is inclined with respect to the radial direction. In the exemplary embodiment shown in the figures, the blades 21 are inclined with respect to the radial direction in the direction denoted by "B." The blades 21 are so dimensioned that the front ends of the blades 21 pass over the gate port 8 and over the chute groove 5. The blades 21 serve to remove a chip part C clogging the gate port 8. The rotary impeller 20 has a center shaft 22 rotatably held by bearings 4 and 13 mounted in the drum body 1 and the cover 11, respectively. The front end of the center shaft 22 protrudes in a forward direction from the cover 11. A follower pulley 23 is mounted to the protruding end of the shaft 22. An electric motor 24 is mounted to the rear surface of the drum body 1 and has a rotating shaft 25 extending through the drum body 1. This shaft 25 is fitted over a driving pulley 26 mounted on the exterior surface side of the cover 11. A belt 27 is trained between the driving pulley 26 and the follower pulley 23. Therefore, the rotary impeller 20 can be rotated in the direction indicated by the arrow B via the driving pulley 26, the belt 27, and the follower pulley 23 by rotating the rotating shaft 25 in the direction indicated by the arrow A.

The method of driving the rotary impeller 20 is not limited to the above-described method using the belt 27. For example, the rotating shaft 25 of the motor 24 may be directly connected to the shaft 22 of the rotary impeller 20 and driven by this shaft.

The operation of the part-aligning apparatus of the construction described above is next described with reference to FIGS. 5 and 6. First, the chip parts C are introduced into the part-holding chamber 12 from the part introduction port 10. The chip parts C are collected in the chute groove 5 by the tapered guide surfaces 2b and 11b formed in the drum body 1 and the cover 11, respectively. The width of the chute groove 5 is equal to the sum of the width W of each chip part C and the given clearance. The depth of the chute groove 5 is equal to the sum of the height H and a certain clearance. This prevents the chip part C from orientating itself crosswise with respect to the chute groove 5. Because parts $C_1$–$C_3$ sliding downward in the chute groove 5 are aligned longitudinally, they pass through the gate port 8 without difficulty as shown in FIG. 6. Then, the chip parts are delivered through the discharge passage 9.

On the other hand, a part $C_4$ sliding downward through the chute groove 5 in an elevated orientation cannot pass through the gate port 8 and thus clogs the gate port 8. Consequently, the following array of parts $C_5$–$C_7$ (e.g., the parts located behind the clogging part) cannot pass through the gate port 8, causing clogging.

In this condition, when the rotary impeller 20 rotates in the direction indicated by the arrow B, the chip part pushed by the front end of one blade 21 or by the body of the blade 21 passes over the gate port 8, thereby displacing the chip $C_4$ in the direction opposite to the discharge direction as shown in FIG. 6. The load imposed on the part $C_4$ is only the weight of the following parts $C_5$–$C_7$ and thereby almost no restricting force acts on the part $C_4$ except for the forces attributed to gravity's pull on the parts. Therefore, the part $C_4$ can be easily removed or displaced sideways without imposing excessive load. As a consequence, the following parts $C_5$–$C_7$ including the part $C_4$ can be discharged from the gate port 8.

In this manner, the dimensions of the chute groove 5 formed between the drum body 1 and the cover 11 effectively determine the orientation of parts C within the chute groove 5 with respect to the height H and the width W of the chip part C. The blades 21 of the rotary impeller 20 affect the orientation of the chip parts C in their longitudinal direction (along the length L). Hence, the alignment efficiency is much higher than that of some known bulk feeders. Furthermore, the rotary impeller 20 can be rotated slowly, since the rate at which the chip parts are delivered is barely affected by the rotational speed of the rotary impeller 20. In this case, the parts are damaged to a lesser extent. In addition, the apparatus is quieter in operation than some known bulk feeders.

In addition, the blades 21 of the rotary impeller 20 act not only to prevent clogging at the gate port 8 but also to stir those chip parts that form bridges over the tapered guide surfaces 2b and 11b and do not easily drop into the chute groove 5. Therefore, the blades dislodge these chip parts and allow these parts to fall into the chute groove 5. If the number of chip parts remaining in the part-holding chamber 12 is reduced, chip parts fall into the chute groove 5 at a decreased rate. However, the chip parts remaining in the part-holding chamber 12 can all be expelled, since the blades 21 of the rotary impeller 20 force the chip parts remaining on the inner surface of the first block 6 toward the chute groove 5. If a large number of chip parts are introduced into the part-holding chamber 12, their load acts on the chip parts aligned near the gate port 8, producing the possibility that movement of the chip parts is impeded. However, the blades 21 pass by the gate port 8 periodically and remove the restriction due to the chip parts' load. Consequently, the chip parts can pass through the gate port 8 smoothly.

In the present invention, each chip part slides down the chute groove 5 by its own weight and is not restricted, unlike some known techniques. Therefore, if the discharge passage 9 becomes clogged or overflows, it is unlikely that the chip part will be damaged or the apparatus will break down. In particular, if the discharge passage 9 becomes clogged or overflows, the chip part C simply stays in the chute groove 5 without being pushed from the rear side. The blades 21 move in the direction opposite to the direction in which the chip part falls. Therefore, chip parts not aligned are simply pushed back in an upward direction without imposing an excessive load. That is, if the discharge passage 9 becomes clogged or overflows, there is a reduced potential that problems will occur provided that the rotary impeller 20 is kept rotating.

Although the blades 21 of the rotary impeller 20 are continuously rotated in the above embodiment, the rotary impeller 20 may be rotated intermittently.

As shown in FIG. 5, when the blades 21 push back the chip part $C_4$ stopped at the gate port 8 to the chute groove 5, if the rotary impeller is continuously rotated, since the chip part $C_5$ is in contact with a back surface of the chip part $C_4$, there is no gap between the chip parts of $C_4$ and $C_5$, thus the chip part $C_4$ is pushed back in the state of standing and doesn't fall down.

Figure 8:
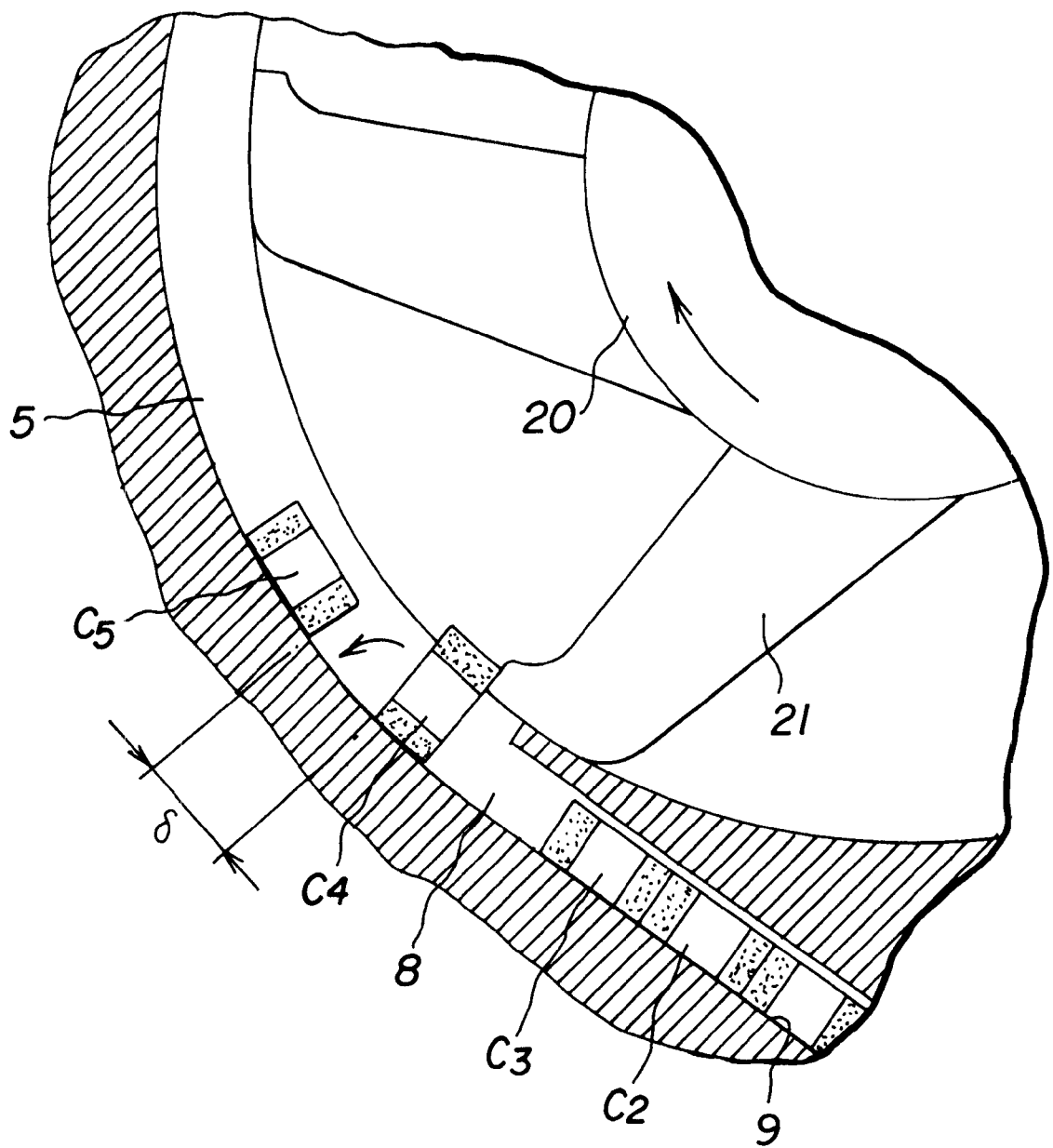
FIG. 8 is an explanatory view of operation when a rotary impeller is rotated intermittently.

On the other hand, if the rotary impeller 20 is rotated intermittently, as shown in FIG. 8, when the blade 21 push back the chip part $C_4$ stopped at the gate port 8, since the blade 21 stops at one time, a gap $\delta$ is provided between the chip parts $C_4$ and $C_5$ by inertia. Due to this gap $\delta$, the chip part $C_4$ falls down backwards and has the normal position. Therefore, the chip part $C_4$ can pass the gate port 8 easily.

When the rotary impeller 20 is rotated intermittently, it would be preferable that the impeller 20 is rotated in a backward direction only a little just after the impeller 20 stops. In such a case, by a change from forward rotation to backward rotation of the rotary impeller, a gap δ can be formed more efficiently between the chip parts $C_4$ and $C_5$.

Figure 9:
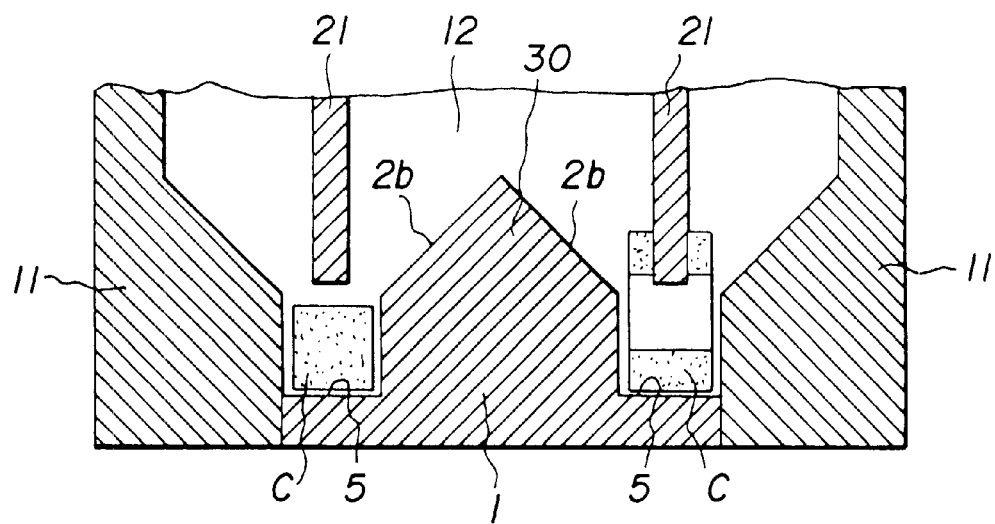
FIG. 9 is a cross-sectional view of another exemplary embodiment of the part-aligning apparatus in accordance with the invention.

Referring next to FIG. 9, there is shown another part-aligning apparatus in accordance with the present invention. Note that like components are indicated by like reference numerals in various figures and that those components which have been already described will not be described below.

In this embodiment, covers 11 are mounted on both sides of the drum body 1. Two chute grooves 5 are formed in the inner surface of the drum body 1. This drum body 1 is substantially cylindrical and has ports at its front and rear sides. An annular portion 30 protruding in an inward direction is formed in the center. Both tapered guide surfaces 2b of the protruding portion 30 are inclined toward the chute groove 5, such that the protruding portion 30 is tapered. A gate port and a discharge passage (none of which are shown) extend continuously at the lower end of each chute groove 5. In the embodiment described first, only one part-holding chamber 12 is formed. In this embodiment shown in FIG. 9, there are two chute grooves 5. This improves the efficiency at which the chip parts C are aligned.

The above embodiment pertains to the alignment of rectangular-shaped chip parts C, each having a width W and a height H such that W≈H, and having a length L which is larger than the width W and H dimensions. The aforementioned part-aligning apparatus can also align cylindrical chip parts C having a diameter d (which effective defines the width W and height H dimensions of the part, e.g., d≈W≈H) and a length L (L>d) as shown in FIG. 10. The apparatus can also align cylindrical chip parts having a diameter d that is equal to the length L, and can also align parts having a diameter d that is greater than the length L.

It is also possible to align rectangular-shaped chip parts C having a width W and height H that are different from each other (e.g., L>W>H, or L>H>W), as shown in FIGS. 11A and 11B. In this case, the parts can be passed through the gate port 8 in a lateral orientation by setting the width of the chute groove greater than W and less than L and setting the height of the gate port 8 greater than H and less than W. The parts can even be passed through the gate port 8 in a vertical orientation as shown in FIG. 11B by setting the height of the gate port 8 greater than W and less than L. Furthermore, the apparatus can align cubic chip parts whose W, H, and L are all substantially equal to each other.

Of course, the invention is not limited to the above exemplary embodiments. For example, in the above embodiments, the center of rotation of the rotary impeller 20 has a coaxial relation to the arc-shaped chute groove 5, and the blades 21 move along the chute groove 5. In the above exemplary embodiments, it is desirable that the blades 21 pass just over the gate port 8; many alternative designs can be used to satisfy this objective. For instance, the center of rotation of the rotary impeller 20 may be placed off the center of radius of curvature of the chute groove 5. In this case, the rotary impeller 20 can be made having a smaller size.

In the above embodiments, the cover(s) are mounted to the drum body, and the chute groove is formed between them. The invention is not limited to this structure. The chute groove may be formed only in the drum body.

It is to be understood that the chute groove is not required to be shaped into an arc. The chute groove may alternatively have a straight inclined shape. Accordingly, it is not necessary that the part-holding chamber be shaped like a circular drum. In addition, the inclined guide surfaces permitting chip parts to slide toward the chute groove are not required to be formed on both sides of the chute groove. Only one inclined guide surface is sufficient. Also, these inclined guide surfaces can be curved.

As can be understood from the above description, the present invention is structured so that chip parts fall into a chute groove, are aligned in a line, and are then passed through the gate port. In this way, the chip parts can be supplied in a given orientation. Therefore, the part-holding chamber is made very simple in structure. Also, the apparatus has reduced potential of breaking down. Each chip part is made to slide along the chute groove by its own weight instead of applying restrictive force to the chip parts one by one. Then, the chip parts are discharged from the gate port. Consequently, the chip parts are prevented from receiving an excessive load. Fewer problems will therefore occur even if the discharge passage is clogged or overflows.

Even if the gate port is clogged with a chip part, the blades of the rotary impeller urge this part toward a direction different from the direction in which chip parts are discharged. This prevents the clogging. As a consequence, the chip parts are damaged to a lesser extent. The part yield can thereby be improved.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A part-aligning apparatus comprising:
   a part-holding chamber for accommodating a number of chip parts, said part-holding chamber having a bottom having an inner surface;
   a chute groove formed at least in the inner surface of the bottom of said part-holding chamber and having a closed bottom surface, said chute groove serving to orient chip parts in a given direction and cause said chip parts to slide successively downward;
   a gate port formed at the lower end of said chute groove and permitting the chip parts sliding downward in a given orientation along said chute groove to pass in succession;
   a discharge passage for aligning the passed chip parts in a line to discharge the passed chip parts; and
   a rotary impeller rotatably held in said part-holding chamber and equipped with blades having front end portions dimensioned so as to pass over said gate port, said blades being rotated in such a direction that a chip part halted in an abnormal orientation in said gate port is displaced in a direction different from a direction in which the chip parts are discharged, thereby preventing said abnormally oriented chip part from clogging the gate port.

2. The part-aligning apparatus of claim 1, wherein said blades displace said abnormally orientated chip part in a direction opposite to a direction in which the chip parts are discharged.

3. The part-aligning apparatus of claim 1, wherein at least one side surface of said part-holding chamber is inclined to cause said chip parts to slide into said chute groove.

4. The part-aligning apparatus of claim 3, wherein both side surfaces of said part-holding chamber are inclined.

5. The part-aligning apparatus of claim 1, wherein said part-holding chamber comprises a cover and a drum body having an inner surface.

6. The part-aligning apparatus of claim 5, wherein said chute groove is formed in an arc-shape and is provided in the inner surface of said drum body.

7. The part-aligning apparatus of claim 6, wherein said discharge passage is formed tangential to the arc-shaped chute groove.

8. The part-aligning apparatus of claim 7, wherein said gate port is formed at a junction between said chute groove and said discharge passage.

9. The part-aligning apparatus of claim 1, wherein said gate port is formed at a junction between said chute groove and said discharge passage.

10. The part-aligning apparatus of claim 1, wherein:
    a plurality of chute grooves are formed in parallel in the inner surface of said part-holding chamber;
    a plurality of gate ports are formed at respective lower ends of said plurality of chute grooves; and
    a plurality of discharge passages are formed for supplying the chip parts coming out of said plurality of respective gate ports.

11. The part-aligning apparatus of claim 10, where said plurality of chute grooves comprise first and second chute grooves, wherein said first chute groove is defined between a first cover and an annular member, and said second chute groove is formed between a second cover and said annular member.

12. The part-aligning apparatus of claim 11, wherein portions of said first and second covers are inclined to direct chip parts into said first and second chute grooves, respectively.

13. The part-aligning apparatus of claim 12, wherein a portion of said annular member is also inclined to direct chip parts into said first and second chute grooves, respectively.

14. The part-aligning apparatus of claim 1, wherein said rotary impeller is driven by a motor.

15. The part-aligning apparatus of claim 14, wherein said motor is connected to a driving pulley via a rotation shaft, and said driving pulley is connected to a follower pulley via a belt, and said follower pulley is connected to said rotary impeller via a center shaft.

16. The part-aligning apparatus of claim 1, further comprising a plurality of chip parts, and wherein:
    each of said chip parts is formed to have a length L greater than its height H and width W;
    said gate port is formed to have a width substantially identical to that of said chute groove and greater than the height H and the width W of the chips parts, but less than the length L of the chip parts;
    said gate port is formed to have a height greater than the height H and the width W of the chip parts, and less than the length L of the chip parts.

17. A method of aligning chip parts, comprising the steps of:
    introducing chip parts into a parts-holding chamber;
    receiving the chip parts into a chute groove having a closed bottom surface;
    sliding said chip parts downward in said chute groove;
    passing said chip parts through a gate port in series providing that said chip parts have a given orientation within said chute groove;
    aligning said passed chip parts in a line for discharge after said chip parts pass through said gate port; and
    rotating a rotary member to urge any chip part halted in an abnormal orientation in said gate port toward a direction different from a direction in which said chip parts are discharged, thereby preventing said gate port from becoming clogged.

18. The method of claim 17, wherein said rotating step comprises displacing said abnormally orientated chip part in a direction opposite to a direction in which the chip parts are discharged.

19. The method of claim 17, wherein said rotary member is rotated such that distal portions of said rotary member pass over said gate port on a regular basis.

20. The method of claim 17, wherein said rotating step comprises rotating said rotary member such that a distal portion thereof engages said abnormally oriented chip part, and thereby dislodges said abnormally oriented chip part from said gate port.

21. The method of claim 20,
    wherein chip parts have a length L which is longer than a width W and height H of the chip parts, wherein said chute groove has a width which is smaller than the length L of the chip parts, but larger than the width W and height H of the chip parts;
    wherein said distal end of said rotary member engages those chip parts that are standing upright within said chute groove.

22. The part-aligning apparatus of claim 1, wherein said chute groove is formed on the inner surface of said part-holding chamber.

23. The part-aligning apparatus of claim 1, wherein said rotary impeller is rotated intermittently.

24. The part-aligning apparatus of claim 1, wherein a guide surface for sliding down the chip part toward the chute groove is formed on the inner surface of the part-holding chamber.

25. The part-aligning apparatus of claim 1, wherein said part-holding chamber is a cylindrical space whose central axis is a horizontal axis, said chute groove is an arc-shaped groove formed on the inner surface of the cylindrical space, said discharge passage is formed substantially tangential to the arc-shaped chute groove, said gate port is provided at the junction between the chute groove and the discharge passage.

* * * * *